(12) United States Patent
Hauenschild et al.

(10) Patent No.: US 7,460,790 B2
(45) Date of Patent: Dec. 2, 2008

(54) NON-LINEAR COMPENSATION OF TIMING JITTER

(75) Inventors: Juergen Hauenschild, Bochum (DE); Thelinh Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 436 days.

(21) Appl. No.: 11/041,488

(22) Filed: Jan. 24, 2005

(65) Prior Publication Data

US 2005/0175355 A1 Aug. 11, 2005

Related U.S. Application Data

(60) Provisional application No. 60/540,791, filed on Jan. 30, 2004.

(51) Int. Cl.
*H04B 10/08* (2006.01)
*H04B 10/00* (2006.01)
*H04B 10/04* (2006.01)

(52) U.S. Cl. .................. 398/192; 398/33; 398/161; 398/194

(58) Field of Classification Search ............... 398/17, 398/23, 25, 26, 38, 159, 161, 192–196, 199, 398/33; 372/29.01, 29.011, 29.014, 29.015, 372/29.016, 33, 38.01, 38.02, 38.07
See application file for complete search history.

(56) References Cited

U.S. PATENT DOCUMENTS

| 5,367,542 | A | 11/1994 | Guo |
| 6,384,661 | B1 | 5/2002 | Livolsi |
| 7,197,252 | B2 * | 3/2007 | Oomori ............... 398/193 |
| 2003/0107333 | A1 | 6/2003 | Shimizu |
| 2004/0013217 | A1 | 1/2004 | Dietrich et al. |
| 2005/0152488 | A1 * | 7/2005 | Buckwalter et al. ....... 375/350 |

* cited by examiner

*Primary Examiner*—Dalzid Singh
(74) *Attorney, Agent, or Firm*—Workman Nydegger

(57) ABSTRACT

Systems and methods for compensating transitions in a data stream to account for jitter including laser jitter. Transitions in the data stream are delayed or advanced depending on the laser jitter and/or whether the previous transition is a rising or falling transition. The compensation of transitions is non-linear such that compensation applied to a rising transition is not necessarily the same as compensation applied to a falling transition. A history of more than one or more bits or transitions of the data stream can be used to further adjust the compensation of transitions in the data stream. When a transition is detected, the bit following the detected transition is peaked either positively or negatively such that the following transition is accordingly delayed or advanced.

21 Claims, 5 Drawing Sheets

NON-LINEAR COMPENSATION OF TIMING JITTER

CROSS REFERENCE TO RELATED APPLICATIONS

This application claims the benefit of U.S. Provisional Patent Application No. 60/540791, filed Jan. 30, 2004 and entitled "NON-LINEAR COMPENSATION OF TIMING JITTER", which is hereby incorporated by reference in its entirety.

BACKGROUND OF THE INVENTION

1. The Field of the Invention

The present invention relates to systems and methods for compensating timing jitter. More particularly, the present invention relates to systems and methods for digitally compensating for timing jitter in an optical transmitter.

2. The Relevant Technology

Lasers and other light emitting devices are important components of many optical systems. The light generated by lasers can be modulated to carry data over fiber optic networks at increasingly faster rates. Although light signals are used to carry data over fiber optic networks, the data carried by the light signals often originates as an electrical signal and the conversion of an electrical signal into a light signal is usually accomplished using an optical transmitter.

Presently, commercially available optical systems use direct on-off keying (OOK) modulation. In such a system, the transmission path of an optical transmitter usually includes a laser driver that modulates the laser current, thereby changing the intensity of the laser light according to the data in the electrical signal. The intensity of the light signal corresponds to the 1's and 0's in the digital data stream. High intensity light represents digital 1's while low intensity light represents digital 0's.

The successful generation and transmission of light signals can depend on the ability of the optical transmitter to convert a high speed electrical data stream into an optical data stream. One of the problems associated with the generation and transmission of light signals in an optical transmitter is jitter. Jitter becomes more problematic as the transmission speed increases. Jitter is often variable and can be generated by a variety of different sources such as impedance mismatch and the bandwidth limitation of the driver and the associated packaging and interconnections, etc. A directly modulated laser produces additional jitter due the laser characteristics itself. The physics of the laser is typically described by the rate equations from which the frequency response and the transient response of the laser to an electrical stimulus can be determined.

As the operating current and the temperature of the laser change, the frequency and the damping factor of the laser's relaxation oscillation can change and have an impact on the settling time of the laser. As the speed of transmission increases, the settling time of this response becomes more important. If the settling time of a laser is more than a single bit period, then jitter will be produced when a transition occurs. Specifically, settling time longer than a single bit period can result in transitions that occur too soon or too late from the ideal position in time. In other words, laser jitter is experienced.

Laser jitter may also have the characteristic of being non-linear. The jitter associated with rising transitions, for example, may be different than the jitter associated with falling transitions. Laser jitter may also be affected by earlier transitions in the data stream. It should also be noted that even though the laser exhibits non-linear jitter characteristics, the jitter may not be random but caused by a particular occurrences of the data sequence. This type of jitter is well known in the industry and it is called deterministic or systematic jitter.

BRIEF SUMMARY OF THE INVENTION

These and other limitations are overcome by the present invention, which relates to systems and methods for compensating timing jitter. The present invention further relates to systems and methods for compensating for non-linear timing jitter that may be associated, for example, with a laser.

A digital data stream is an electrical or optical representation of data and typically includes signal levels that can be interpreted as 0's or 1's. Rising transitions occur when the data stream changes from a level associated with a 0 to a level associated with a 1. Falling transitions occur when the data stream changes from a level associated with a 1 to a level associated with a 0.

Because of jitter, some lasers or transmitters may not be able to effectively transmit a data stream at higher rates and embodiments of the present invention adjust the transitions in the data stream to compensate for laser jitter including non-linear jitter. Since the jitter is deterministic, a jitter compensation circuit, for example, may be used to compensate the digital data stream for jitter before the digital data stream is transmitted by the laser. In this example, the jitter compensation circuit typically operates on the data stream after the clock and data recovery circuitry but before the laser driver.

The jitter compensation circuit looks at a present transition in the data stream and may be set to either advance or delay the following transition. By advancing or delaying the following transition in one example, the expected effect of laser jitter can be compensated for by the jitter compensation circuit such that the quality of the signal transmitted by the laser is improved.

In one embodiment, the data stream is received by the jitter compensation circuit and transitions are detected by a transition detector circuit. When a transition is detected, the level preceding the next transition is shifted either positively or negatively thereby either delaying or advancing the transition. A limiting circuit associated with the laser driver typically removes the amplitude variation and retains a digital data stream with a timing jitter that is pre-compensated for expected laser jitter. As a result, the jitter compensation circuit is able to either advance or delay transitions in the data stream to pre-compensate for proceeding laser jitter.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention relates to systems and methods for compensating a digital data stream for laser jitter. More particularly, the present invention relates to systems and methods for non-linearly compensating for laser jitter. Broadly stated, jitter is the uncertainty in the timing of transitions or a short term variation of a transition or digital signal from an ideal position. As previously described, lasers have or generate their own jitter that may be related, for example, to the relaxation oscillation frequency of the laser and the rate of data transmission. If the laser does not settle by the time the next transition in the data stream occurs, then jitter occurs and can be seen, for example, in the eye diagram. Jitter in the data stream may also be related to other sources that may include, but are not limited to, variations in temperature, current, voltage, extinction ratio, and the like.

Figure 1:
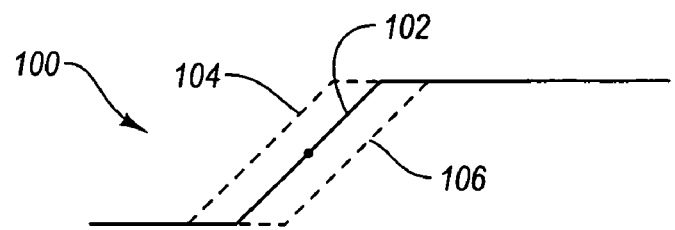
FIG. 1 illustrates an example of jitter associated with a transition of a data stream.

FIG. 1 illustrates one example of jitter. The waveform 100 in FIG. 1 includes a typical transition 102 that is in an ideal location. The transition 102 in this example represents the transition from a low or "0" to a high or "1" optical value. Jitter relates to movement around the normal zero point of a transition. Thus, the transition 104 and the transition 106 represent transitions that are caused by laser jitter. The transitions 104 and 106 are not in an ideal location. In other words, the jitter of a laser may cause the transition to be either accelerated or delayed.

As previously stated, too much jitter may preclude a laser from being used in certain situations, particularly high transmission speed applications. Thus, the transmission speed of a particular laser is often limited by the laser's jitter. Embodiments of the invention pre-compensate a digital data stream for laser jitter. By pre-compensating the data stream for laser jitter, the rate at which a particular laser can transmit can be increased.

One advantage of embodiments of the present invention is that transitions in the data stream are compensated such that the output data of the laser has transitions that are closer to the ideal locations. In other words, the effect of laser induced jitter is reduced. Advantageously, lasers that were previously unusable in, for instance, high speed applications can now be used in those applications because of the compensation applied to the transitions in the data stream by embodiments of the invention.

Additionally, the compensation applied to transitions in the data stream is not always constant. The compensation applied, for example, to rising transitions may differ from the compensation applied to falling transitions. The compensation is therefore non-linear in at least this sense. The actual gain (either positive or negative) is often related to the characteristics of a particular laser. In fact, the compensation applied to transitions in the data stream may be tailored to a particular laser or to a batch of lasers because laser jitter is often not the same from one laser to the next or from one batch of lasers to the next.

Figure 2:
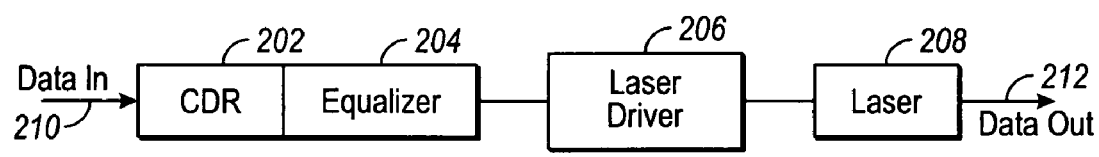
FIG. 2 illustrates an example of a transmission path for optical signals that may be affected by laser jitter.

FIG. 2 is a block diagram of a transmit path in an optical transmitter such as an optical transceiver. Data 210 is received by a clock and data recovery (CDR) 202. The CDR 202 recovers the clock signal and the data from the data 210 and is used to retime the data such that it can be transmitted using the laser 208. As previously stated, however, the laser 208 often has its own jitter that can affect the data 212 that is transmitted by the laser 208. Embodiments of the present invention include an equalizer 204 that distorts the data that has been processed by the CDR 202 in a manner to compensate for the jitter of the laser 208. In one embodiment, the equalizer 204 shifts (both positively and negatively) the level of the bits in the data stream such that the following transition is either advanced or delayed. The equalizer 204 may also compensate for other sources of jitter including, but not limited to, temperature variations, current variations, impedance mismatch, band limitations, and the like or any combination thereof.

The jitter of the laser and/or of other sources may not be a linear relationship. For example, the jitter of the laser associated with a rising transition is usually different than the jitter of the laser associated with a falling transition. The laser jitter associated with a particular transition may also be related to one or more of the previous transitions. Thus, laser jitter is often non-linear. Advantageously, the equalizer 204 compensates for the non-linearity of the laser jitter.

Figure 3:
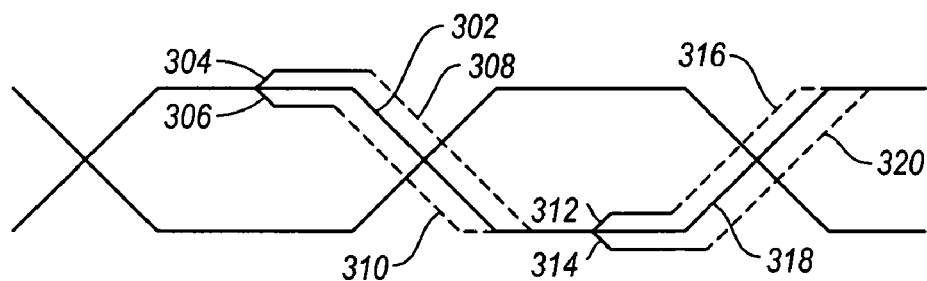
FIG. 3 is an example of an eye diagram of a data stream and also illustrates positive and negative shifting of a bit to either advance or delay the following transition in the data stream.

FIG. 3 is a diagram that illustrates how the equalizer 204 can account or compensate bits in the data stream for the jitter introduced by the laser, temperature variations, and the like. The diagram 300 illustrates a falling transition 302 that is in an first location. The equalizer 204 can adjust the transition 302 based on the jitter of the laser 208 and/or the jitter related to previous transitions in the data stream. In this example, the equalizer 204 can either advance the transition as illustrated by the transition 310 or delay the transition as illustrated by the transition 308. By advancing or delaying the transition, the transition, when transmitted by the laser, is closer to the ideal position. Thus, the equalizer 204 pre-compensates transitions in the data stream before the data stream is transmitted. The rising transition 318 can be delayed as illustrated by the transition 320 or accelerated as illustrated by the transition 316. The compensation applied to the data stream improves the quality of the signal transmitted by the laser.

FIG. 3 also illustrates that signal peaking may also be involved when the equalizer 204 compensates for laser jitter. The peak 304 is associated with the delayed transition 308 and the negative peak 306 is associated with the advanced transition 310. Similarly, for a rising transition, the positive peak 312 is associated with the accelerated transition 316 and the negative peak 314 is associated with the delayed transition 320. In the transmission path illustrated in FIG. 2, the laser driver 206 may limit the waveform to eliminate the peaks 304 and 306. In other words, the laser driver 206 removes the amplitude variation used to advance or delay the transitions in the data stream without removing the jitter or timing compensation applied by the equalizer 204.

Advancing or delaying a transition is an example of compensating for laser jitter, for jitter related to the temperature of the laser, and the like or any combination thereof. An equalizer is added to the CDR to compensate for expected laser jitter. In one embodiment, the equalizer pre-compensates for the expected laser jitter. After the equalizer pre-compensates for the expected laser jitter, the output of the laser has transitions that are closer to their expected or ideal locations. Advantageously, lasers that would otherwise be deemed unusable can be used because the data stream is compensated for the laser jitter of the lasers that would render the lasers unusable otherwise.

As previously mentioned, the jitter is deterministic in nature. Therefore the jitter of a particular laser can be determined after the laser is manufactured. The jitter of the laser in relation to temperature, voltage, and/or current can also be determined after the laser is manufactured. With this information or these characteristics, the transitions in the data stream can be adjusted by the equalizer to compensate for the laser jitter.

The laser jitter associated with a particular transition in the data stream may be related to at least one previous transition. Thus, in one embodiment of the present invention, at least one transition of the data stream is tracked or detected and can be used to compensate for the laser jitter. Typically, transitions nearest in time to a current transition have the greatest impact on laser jitter. The present invention is thus described in terms of the current transition and the previous transition although one of skill in the art can appreciate that multiple previous transitions can be stored and used to compensate for laser jitter, the effect of temperature on laser jitter, and the like. The following table illustrates the possible combinations when two transitions are tracked.

| Previous Transition Type | Current Transition Type | Corresponding Bit Sequence |
|---|---|---|
| No Transition | No Transition | 0 0 0 or 1 1 1 |
| No Transition | Rising Transition | 0 0 1 |
| No Transition | Falling Transition | 1 1 0 |
| Rising Transition | No Transition | 0 1 1 |
| Falling Transition | No Transition | 1 0 0 |
| Rising Transition | Falling Transition | 0 1 0 |
| Falling Transition | Rising Transition | 1 0 1 |

In this table the first two bits represent the previous transition and the last two bits represent the current transition. Thus, for the sequence 001, the 00 corresponds to the previous transition (no transition in this case) and the 01 represents the current transition (a rising transition in this case). Alternatively, compensation of the transition can be based on whether a transition is present as well as the type of transition.

When the current transition type is not a transition (as shown by the bit sequences 00 and 11), no action is typically taken to compensate the data stream for laser jitter. Thus for bit sequences of 000, 111, 011, and 100, the equalizer does not compensate the transition because no transition is present in the data stream. Even if peaking is applied, a limiting circuit associated with the laser driver will clip the peaking from the signal when no transition is present. When the previous transition does not actually correspond to a transition, as illustrated by the bit sequences of 000, 111, 001, and 110, the equalizer is not required to compensate the current transition. Thus, the equalizer may only compensate the transition if a previous transition was present. Alternatively, the equalizer may compensate the current transition regardless of the previous transition type.

The current transition is usually compensated by either advancing the transition or by delaying the transition when the previous transition is a rising transition or a falling transition as shown by the bit sequences of 010 and 101. As previously discussed, the effect on laser jitter of a rising transition is not usually linearly related to the effect on laser jitter of a falling transition. The equalizer thus compensates the data stream or the transitions non-linearly. In another embodiment, when the bit sequence is 001 or 110, the equalizer can also compensate the current transition even though the previous transition type is not a transition.

Figure 4:
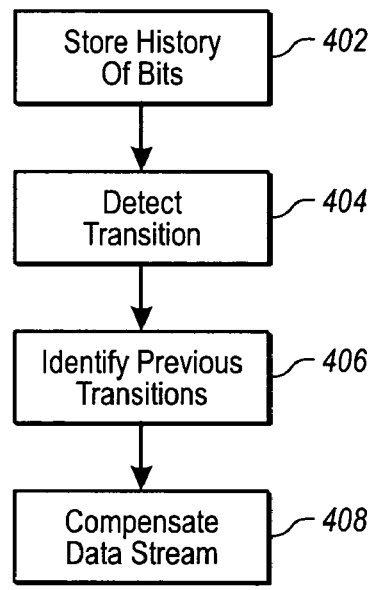
FIG. 4 is one example of a method for compensating transitions in a data stream to account for laser jitter.

FIG. 4 is a flow diagram illustrating an exemplary method for compensating the transitions of a data stream for laser jitter, temperature effects on laser jitter, voltage, and the like or any combination thereof. As the CDR processes an incoming data stream to recover the clock and the data, a history of the bits in the data stream is maintained (402). The bits can be stored in memory, in a shift register, or any other component known in the art. A one bit memory, a two bit memory, or larger memories may be used depending on the bits that need to be stored for a particular implementation.

When a current transition is detected (404), the previous transition is identified (406). Both the current transition and the previous transition usually have a type (rising, falling, or none) as discussed previously. The current transition is compensated, in one embodiment, when it is either a rising or falling transition and the previous transition was a falling or rising transition, respectively. Depending on which combination is detected (101 or 010), the current transition is either advanced or delayed (408). Determining how to compensate the current transition can use, for example, a table stored in memory that identifies the laser jitter in a variety of different situations (laser jitter, laser jitter at different temperatures, laser jitter at different bias currents, and the like). As illustrated in FIG. 3, shifting bit level may be used to either advance or delay the transition.

Alternatively, when a current transition is detected (404), identifying the previous transition (406) is optional and the transition may be compensated based on the fact that a transition was detected. This example only requires a one bit memory. The transition is compensated based on whether the transition is a rising or falling transition (408).

Figure 5A:
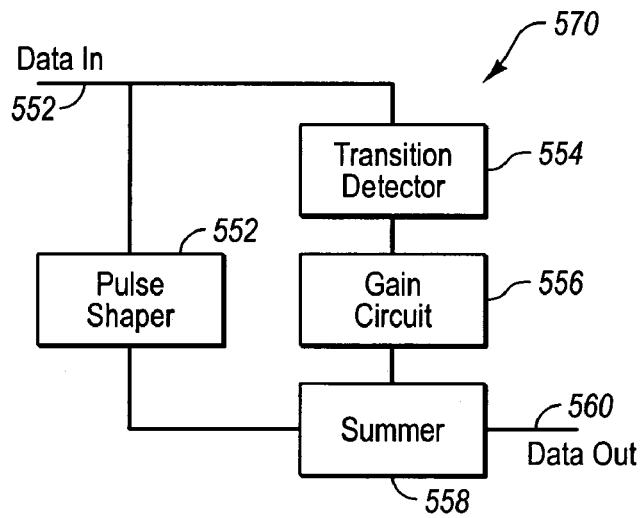
FIG. 5A is an exemplary circuit for compensating for laser jitter in a non-linear manner.

FIG. 5A illustrates one example of an equalizer 570. The data in 550 represents an electrical data stream that has been processed by a CDR. The clock is therefore available to the equalizer 570 or another clocking source may be used. The transition detector 554 delays bits in the data stream and is able to detect a transition in the data stream that follows a particular bit.

The gain circuit 556 provides the amount of shifting of the level of the bit at the summer 558 to achieve the desired delay or advance of the next transition. The gain circuit 556 is configured to apply a different gain or a non-linear gain according to whether a rising transition or a falling transition is detected by the transition detector 554. The gain circuit 556 can thus reduce or increase a voltage or current level of a particular bit such that the transition is advanced or delayed. The pulse shaper shapes the transition and delays the data stream such that the appropriate bit is adjusted at the summer 558. The equalizer 570 thus generates a data stream that is compensated for laser jitter. The data out 560 transmitted by the laser has transitions that are closer to ideal positions.

Figure 5B:
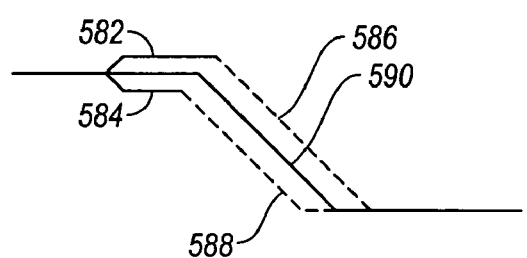
FIG. 5B illustrates an example of a transition in a data stream that is detected and compensated by an equalizer.

FIG. 5B illustrates an example of a transition that is detected and compensated by an equalizer. The transition detector 570 detects, in this example, a falling transition 590 in the data stream. The pulse shaper 552 delays the data stream such that positive shifting 582 or negative shifting 584 (depending on whether the transition is advanced or delayed) is applied prior to the detected transition at the summer 560. In other words, the pulse shaper 552 delays the data stream enough for the transition to be detected by the transition circuit such that shifting is applied to the appropriate bit preceding the transition.

Figure 5C:
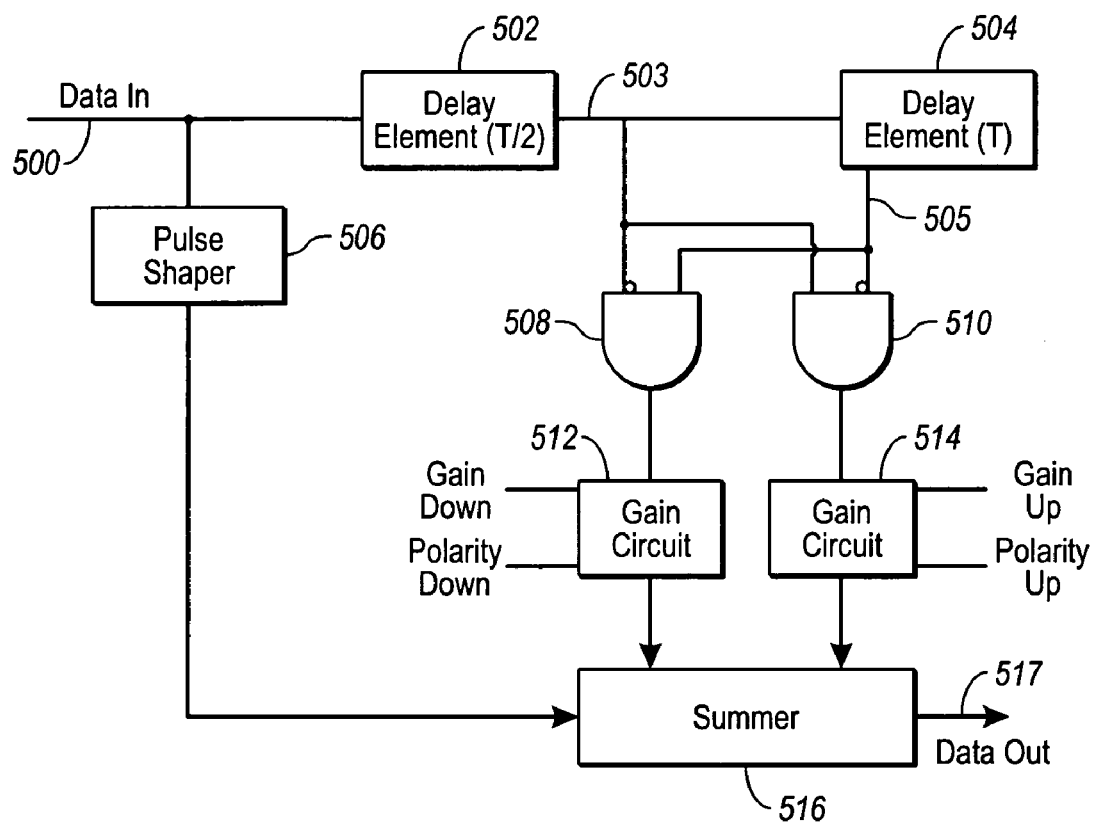
FIG. 5C is another example of a circuit for compensating for laser jitter.

FIG. 5C illustrates a block diagram of circuitry for compensating the transitions of a data stream. As described, adjusting a current transition may depend on a status of a previous transition although as described herein, transitions can be compensated without regard to previous transitions. The circuitry of FIG. 5 typically uses the clock that is recovered from the CDR. The data 500 is delayed by a delay element 502 and then delayed a second time by the delay element 504. The delay element 502 may have a delay of T/2 (half a period) while the delay element 504 may have a delay T (a full period). Delay can also be generated without the use of the clock from the CDR.

The delay introduced by the delay elements 502 and 504 enables the logic gates 508 and 510 to examine a particular transition and identify whether the transition is a rising transition or a falling transition. The output of the gate 508 is a 1 or high only when the output of the delay element 503 is a 0 and the output of the delay element 504 is a 1. The output of the gate 510 is a 1 or high only when the output of the delay element 503 is a 1 and the output of the delay element 504 is a 0. Thus, the gate 508 detects a falling transition and the gate 510 detects a rising transition with its output delayed be T/2, i.e. half a bit period. In this example, the gates 508 and 510 are AND gates. Also, one of the inputs at each AND gate, as illustrated, is inverted.

The block 512 and the block 514 are used to weight or provide gain to the outputs of the gates 508 and 510 respectively depending on the type of transition sequence that is detected. The Gain Down input and the Gain Up input to the blocks 512 and 514 determine how much shifting of the level of the bit is applied to bits in the data stream. The gain (positive or negative) is illustrated in FIG. 5B and described above and referred to as peaking. The weight applied by the blocks 512 causes the waveform of the data stream to peak such that the appropriate transition is either delayed or advanced.

Figure 5D:
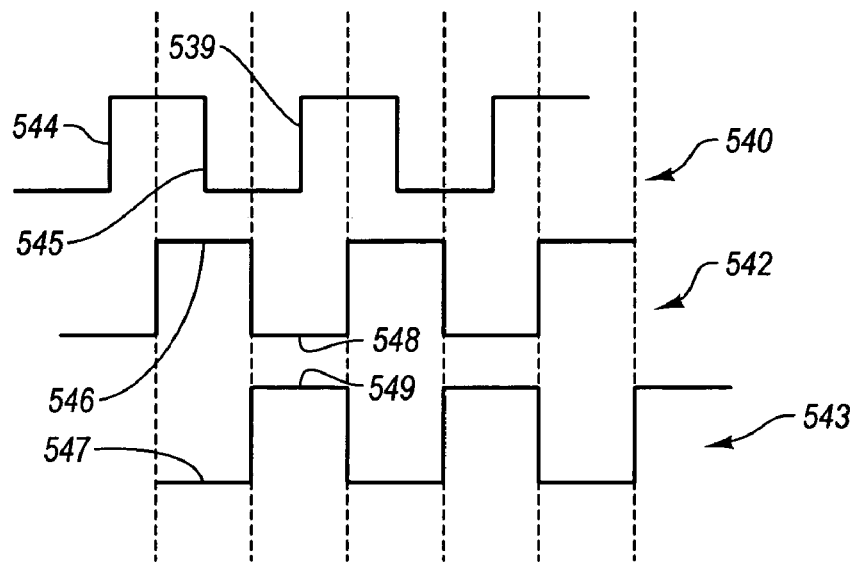
FIG. 5D illustrates a data stream, a data stream delayed by a half period, and a data stream delayed by a full period and illustrates how a transition is detected.

The circuit illustrated in FIG. 5C detects a current transition and compensates the following transition. For example, FIG. 5D illustrates a data stream 543 that is delayed one bit period from the data stream 542. The data stream 542 is delayed half a bit period from the data stream 540. The transition being examined is the transition 544, which is a rising transition. The delay elements 502 and 504 output the bit 546 (a "1") and the bit 547 (a "0") to the logic gates 508 and 510. In this gate the gate 510 outputs a "1", which indicates a rising transition. If no transition is detected, then no compensation occurs. However, even if compensation (the bit is peaked, for example) is applied when no transition, it has no effect because the variable amplitude is removed later as previously described.

Thus, when the transition 544 is being examined, the following transition 545 is compensated based on whether the transition 544 is a rising or a falling transition. Thus, the transition 544 is a previous transition with respect to the transition 545. When the falling transition 545 is examined, the bits 548 and 549 produce a "1" at the output of the gate 508, which identifies a falling transition. The following transition 539 is then compensated accordingly. In this manner, embodiments of the invention can compensate a data stream for laser jitter and/or for laser jitter that is associated with previous transitions in the data stream.

With reference to FIG. 5C, the pulse shaper 506 typically shapes the transition of the data stream such that it can be more effectively advanced or delayed. The pulse shaper 506 may also include a delay element such that the outputs of the blocks 512 and 514 are acting on the correct bit or portion of the data stream at the summer 516. Typically, the pulse shaper delays the data stream such that compensation or peaking is applied prior to the transition that follows the transition detected by the gates 508 and 510. The summer 516 combines the outputs of the blocks 512, 514, and the output of the pulse shaper 506 to generate data out 517 that has compensated transitions to account for the laser jitter.

Figure 6:
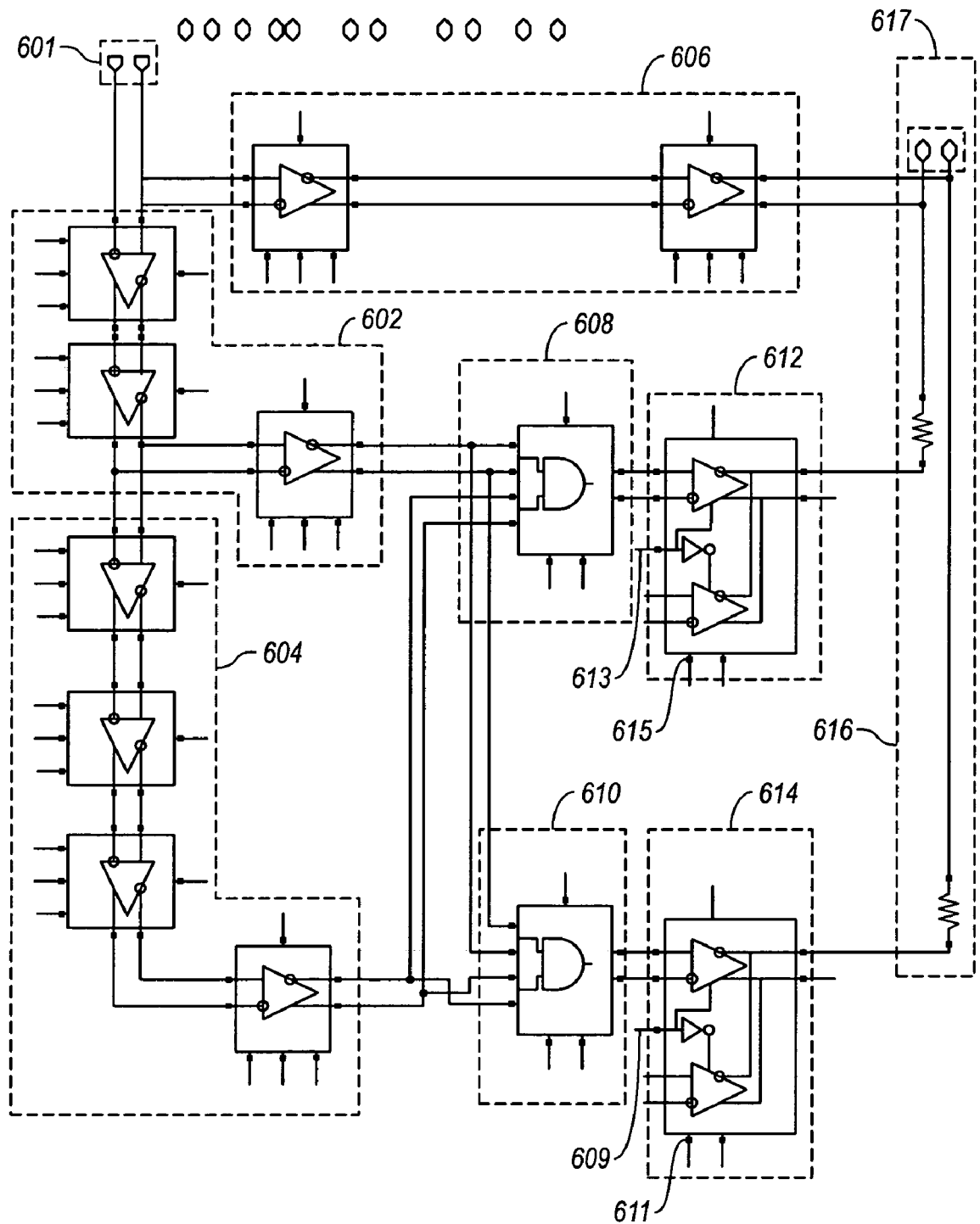
FIG. 6 is a schematic diagram of an exemplary circuit for non-linearly compensating for laser jitter by advancing or delaying transitions in a data stream.

FIG. 6 illustrates one embodiment of an equalizer and also illustrates an embodiment using differential input. The differential input 601 represents, for example, a data stream having transitions that the equalizer 600 adjusts. The block 602 includes a series of buffers that delays the data stream by, for example one half of a period. The block 604 includes another series of buffers that delays the data stream by another period. The output of the block 602 and 604 are fed into the logic gates 608 and 610. The gates 608 and 610 are differential AND gates in this example and are used to detect transitions in the data stream as previously described.

The block 612 and the block 614 are used to provide a peak (either positive or negative) that alters a bit such that the associated transition is either advanced or delayed. The outputs of the block 612 and 614 are summed by the summer 616 to provide the peak that advances or delays the proper transition. The pulse shaper 606 shapes the pulse and delays the data stream such that the appropriate transition of the data stream at the output 617 is advanced or delayed.

Peaking can be applied to the various bits by the blocks 612 and 614 even if no transition is present in the data stream because a limiter that is used on the signal at a later point in the transmission path eliminates the potential detrimental effects of peaking (such as turning off the laser completely in some instances) from the data stream.

The characteristics of the laser used to transmit data are usually determined beforehand. In other words, the laser jitter may be known. The amount of compensation required for the transition following a rising transition is known and the compensation required for the transition following a falling transition is also known.

The block 612 has a polarity input 613 and a gain input 615. The block 614 has a polarity input 609 and a gain input 611. Because the laser jitter characteristics are known, the inputs 609, 611, 613, and 615 can be preprogrammed. Thus, when the gate 608 detects a falling transition, the block 615 is enabled to add the gain 615 to the data stream such that the following transition is compensated. For falling transitions detected by the gate 608, the polarity input 613 determines if the peaking is positive or negative and the gain input 615 determines how much peaking is applied to compensate the following transition. For rising transitions detected by the gate 610, the block 614 is similarly configured such that the polarity input 609 determines if the peaking is positive or negative and the gain input 611 determines how much peaking or gain is applied to compensate the following transition.

As previously stated, the laser jitter characteristics are usually known, the polarity inputs 609, 613 are typically set based on the jitter characteristics. The gain inputs 611, 615 are also typically set based on the jitter characteristics. Thus, the same amount of peaking is applied by the box 612 to each transition following a falling transition and the same amount of peaking is applied by the box 614 to each transition following a rising transition. However, the peaking applied by the box 612 is not necessarily the same as the peaking applied by the box 614. The polarity input 613 can cause either positive or negative peaking to be applied by the box 612. Similarly, the polarity input 609 can cause either positive or negative peaking to be applied by the box 614.

Figure 7:
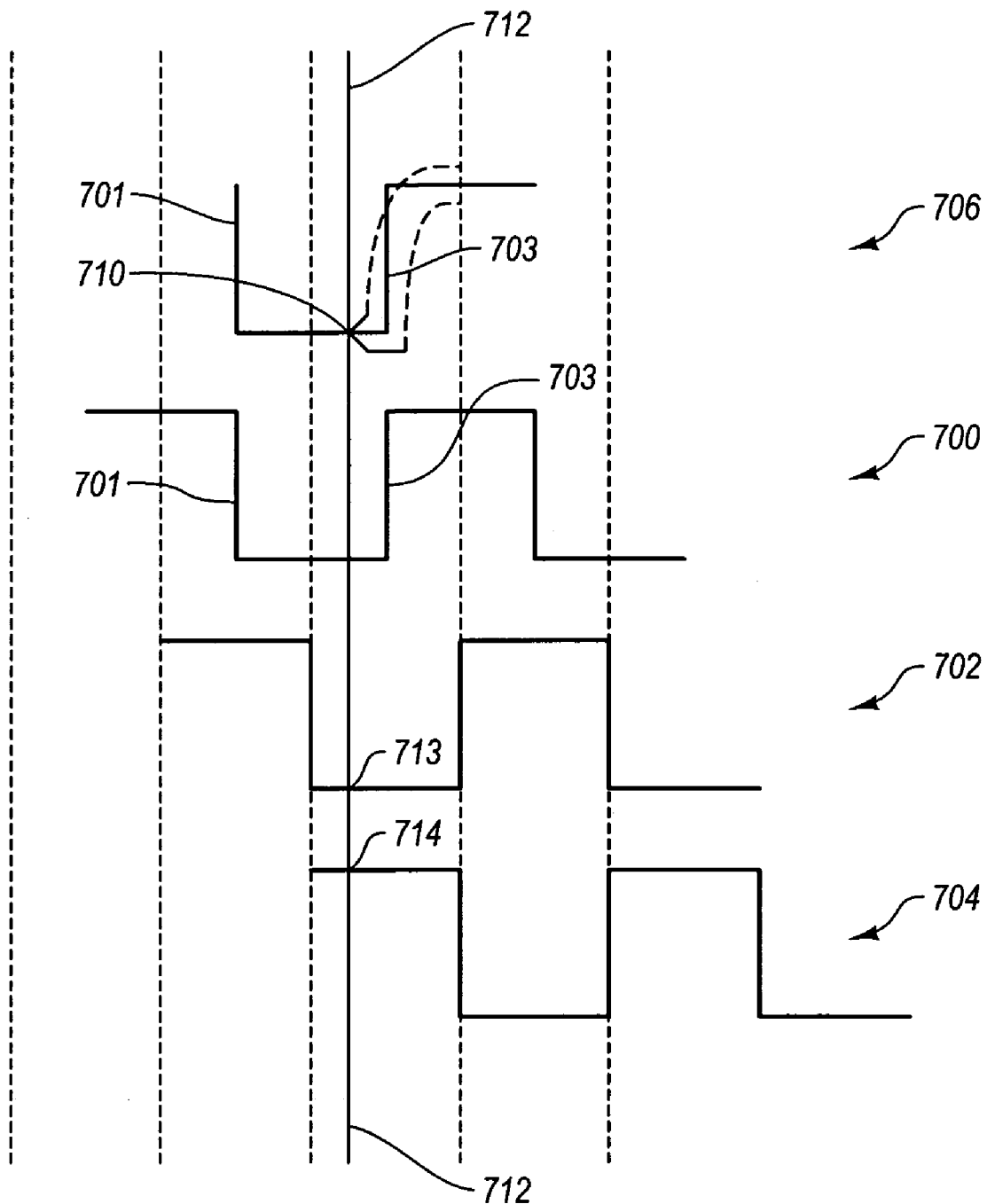
FIG. 7 illustrates the detection of a transition and the corresponding peaking of a bit to either advance or delay the following transition.
Figure 6:
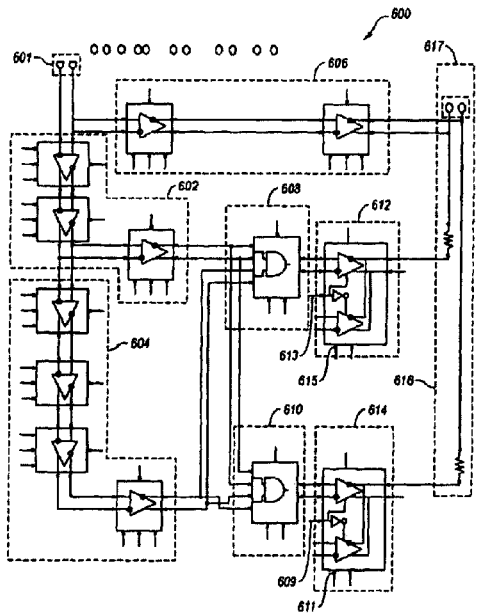

FIG. 7 illustrates an example of how the data stream can be compensated by embodiments of the invention. The data stream 700 is input into an equalizer. The data stream 702 represents the data stream 700 delayed by half a bit period and the data stream 704 illustrates the data stream delayed by a bit period. The data stream 706 corresponds to the data stream 700 delayed by the pulse shaper. At time 712, the gates 508, and 510 (see FIG. 5) compare the bits 713 and 714 and determine that the transition 701 is a falling transition (both inputs to the gate 508 will be a "1"). At the point 710, peaking is applied by the block 512 such that the transition 703 is delayed or advanced.

Advantageously, transitions in a data stream can be compensated to account for laser jitter before the data stream is actually transmitted by the laser. Another advantage is that as a laser ages and its jitter characteristics change, the polarity inputs and/or the gain inputs can be changed to adapt the compensation to the new jitter characteristics.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

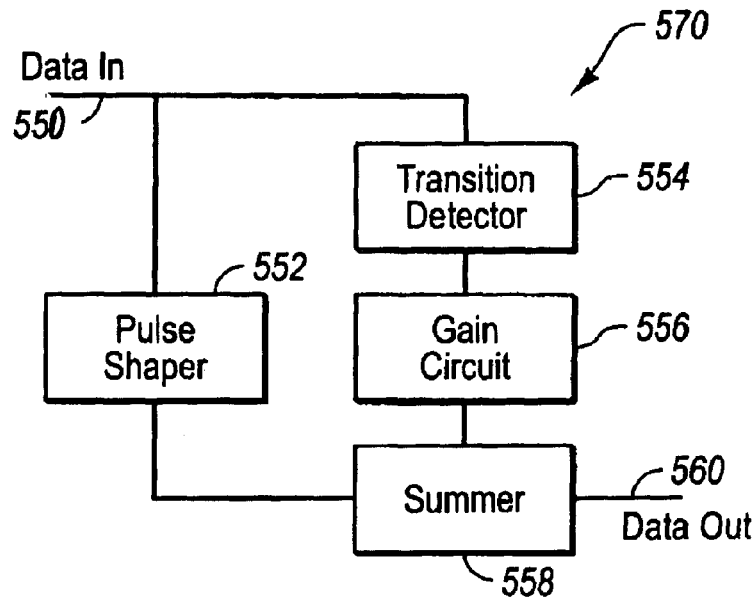

What is claimed is:

1. A circuit for compensating for laser jitter in a data stream that is transmitted by a laser included in an optical transmitter, the circuit comprising:
    a transition detector that detects transitions in a data stream;
    a gain circuit that provides gain to the data stream when transitions are detected by the transition detector;
    a pulse shaper that delays the data stream while the transition detector detects transitions; and
    a summer that sums the gain from the gain circuit with the data stream that is delayed by the pulse shaper such that the transitions in the data stream are compensated for at least laser jitter of the laser.

2. A circuit as defined in claim 1, wherein the transition detector further comprises a first delay element and a second delay element in series.

3. A circuit as defined in claim 2, wherein the first delay element Delays the data stream for half a period and the second delay element delays the data stream for a full period.

4. A circuit as defined in claim 2, wherein the transition detector further comprises:
    a first logic gate connected to the first delay element and the second delay element; and
    a second logic gate connected to the first delay element and the second delay element.

5. A circuit as defined in claim 4, wherein the first logic gate detects a falling transition and the second logic gate detects a rising transition.

6. A circuit as defined in claim 5, wherein the gain circuit receives outputs of the first logic gate and the second logic gate and provides the gain associated with the transitions in the data stream based in part on the outputs of the first logic gate and the second logic gate.

7. A circuit as defined in claim 1, wherein the pulse shaper shapes the transitions in the data stream.

8. A circuit as defined in claim 1, wherein rising transitions are compensated by a first gain and falling transitions are compensated by a second gain.

9. A method for compensating transitions of a data stream for laser jitter, the method comprising:
    storing a history of at least one bit of the data stream, wherein the history includes a current bit, wherein storing a history of at least one bit further comprises delaying the data stream with a first delay element and a second delay element;
    detecting at least one transition in the data stream based on the history of at least one bit, the at least one transition including a transition occurring after the current bit, wherein detecting at least one transition in the data stream further comprises:
        detecting a falling transition with a first AND gate having as inputs an inverted output of the first delay element and an output of the second delay element; and
        detecting a rising transition with a second AND gate having as inputs the output of the first delay element and an inverted output of the second delay element;
    compensating the current bit either positively or negatively such that the transition occurring after the current bit is compensated in the data stream, wherein compensating the current bit such that the transition is compensated in the data stream further comprises weighting an output of the first AND gate and of the second AND gate; and
    summing the weighted output of the first AND gate and the second AND gate with an output of the pulse shaper such that the current bit in the data stream is peaked before the current transition, thereby compensating the transition occurring after the current bit.

10. A method as defined in claim 9, wherein compensating the current bit such that the transition occurring after the current bit is compensated in the data stream further comprises delaying the data stream in a pulse shaper.

11. A method as defined in claim 9, wherein compensating the current bit such that the transition occurring after the current bit is compensated in the data stream further comprises advancing the current transition.

12. A method as defined in claim 9, wherein pre-compensating the current bit such that the current transition is compensated in the data stream further comprises delaying the current transition.

13. A circuit for compensating a transition in a data stream to account for laser jitter, the circuit comprising:
    a first delay element in series with a second delay element, wherein the first delay element delays a data stream by a first amount and the second delay element delays the data stream by a second amount;
    a first logic gate connected to the first delay element and the second delay element such that an output of the first logic gate is high when a falling transition is occurs in the data stream;
    a second logic gate connected to the first delay element and the second delay element such that an output of the second logic gate is high when a rising transition occurs in the data stream;
    a gain circuit connected to the first logic gate and the second logic gate that provides a gain depending at least on whether a rising or falling transition is detected in the data stream; and
    a pulse shaper that delays the data stream such that the gain of the weighting element is summed with the data stream prior to transitions detected by the first logic gate and the second logic gate such that the transitions are either advanced or delayed.

14. A circuit as defined in claim 13, wherein the first delay element includes a plurality of buffers and the second delay element includes a plurality of buffers.

15. A circuit as defined in claim 13, wherein the first logic gate is an AND gate having an inverted output of the first delay element and an output of the second delay element as inputs.

16. A circuit as defined in claim 13, wherein the second logic gate is an AND gate having an inverted output of the second delay element and an output of the first delay element as inputs.

17. A circuit as defined in claim 13, wherein the pulse shaper includes a plurality of buffers.

18. A circuit as defined in claim 13, wherein the gain circuit includes an input for negative gain, an input for positive gain, an input for polarity down and an input for polarity up.

19. A circuit as defined in claim 13, further comprising a summer for summing the gain of the gain circuit with an output of the pulse shaper such that a bit following each detected transition is peaked either such that a transition following each detected transition is compensated.

20. A circuit as defined in claim 19, wherein a particular bit is peaked positively to delay a transition following the particular bit if the detected transition was a rising transition, and wherein the particular bit is peaked negatively to advance a transition following the particular bit if the detected transition was a rising transition.

21. A circuit as defined in claim 19, wherein a particular bit is peaked negatively to delay a transition following the particular bit if the detected transition was a falling transition, and wherein the particular bit is peaked positively to advance a transition following the particular bit if the detected transition was a falling transition.

* * * * *

UNITED STATES PATENT AND TRADEMARK OFFICE
CERTIFICATE OF CORRECTION

PATENT NO. : 7,460,790 B2
APPLICATION NO. : 11/041488
DATED : December 2, 2008
INVENTOR(S) : Hauenschild et al.

It is certified that error appears in the above-identified patent and that said Letters Patent is hereby corrected as shown below:

Delete Title Page shown an illustrative figure and substitute the attached Title Page.

Drawings
Sheet 1, replace Fig. 3 with the figure depicted below, wherein "300" has been added.

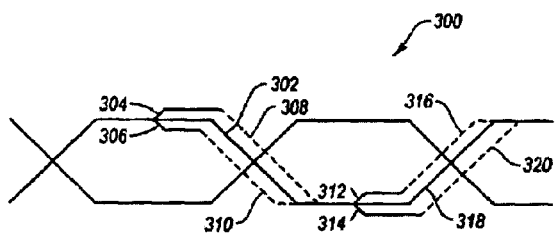

Fig. 3

Drawings
Sheet 5, replace Fig. 5A with the figure depicted below, wherein "552" has been changed to --550--

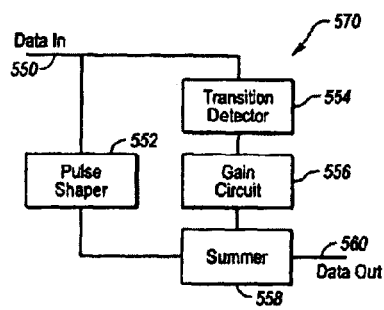

Fig. 5A

Signed and Sealed this

Twenty-eighth Day of September, 2010

David J. Kappos
Director of the United States Patent and Trademark Office

Drawings
Sheet 5, replace Fig. 6 with the image depicted below, wherein the equalizer "600" has been added.

Column 2
Line 3, before "particular" delete "a"

Column 4
Line 44, change "an first" to --a first--

Column 7
Line 5, change "560" to --558--

Column 10
Line 56, before "occurs" delete "is"

CERTIFICATE OF CORRECTION (continued)

(12) United States Patent
Hauenschild et al.

(10) Patent No.: US 7,460,790 B2
(45) Date of Patent: Dec. 2, 2008

(54) NON-LINEAR COMPENSATION OF TIMING JITTER

(75) Inventors: Juergen Hauenschild, Bochum (DE); Thelinh Nguyen, San Jose, CA (US)

(73) Assignee: Finisar Corporation, Sunnyvale, CA (US)

(*) Notice: Subject to any disclaimer, the term of this patent is extended or adjusted under 35 U.S.C. 154(b) by 436 days.

(21) Appl. No.: 11/041,488

(22) Filed: Jan. 24, 2005

(65) Prior Publication Data
US 2005/0175355 A1    Aug. 11, 2005

Related U.S. Application Data

(60) Provisional application No. 60/540,791, filed on Jan. 30, 2004.

(51) Int. Cl.
*H04B 10/08* (2006.01)
*H04B 10/00* (2006.01)
*H04B 10/04* (2006.01)

(52) U.S. Cl. .................. 398/192; 398/33; 398/161; 398/194

(58) Field of Classification Search ............ 398/17, 398/23, 25, 26, 38, 159, 161, 192–196, 199, 398/33; 372/29.01, 29.011, 29.014, 29.015, 372/29.016, 33, 38.01, 38.02, 38.07
See application file for complete search history.

(56) References Cited

U.S. PATENT DOCUMENTS

| | | | |
|---|---|---|---|
| 5,367,542 A | 11/1994 | Guo | |
| 6,384,661 B1 | 5/2002 | Livolsi | |
| 7,197,252 B2 * | 3/2007 | Oomori | 398/193 |
| 2003/0107333 A1 | 6/2003 | Shimizu | |
| 2004/0013217 A1 | 1/2004 | Dietrich et al. | |
| 2005/0152488 A1 * | 7/2005 | Buckwalter et al. | 375/350 |

* cited by examiner

*Primary Examiner*—Dalzid Singh
(74) *Attorney, Agent, or Firm*—Workman Nydegger

(57) ABSTRACT

Systems and methods for compensating transitions in a data stream to account for jitter including laser jitter. Transitions in the data stream are delayed or advanced depending on the laser jitter and/or whether the previous transition is a rising or falling transition. The compensation of transitions is non-linear such that compensation applied to a rising transition is not necessarily the same as compensation applied to a falling transition. A history of more than one or more bits or transitions of the data stream can be used to further adjust the compensation of transitions in the data stream. When a transition is detected, the bit following the detected transition is peaked either positively or negatively such that the following transition is accordingly delayed or advanced.

21 Claims, 5 Drawing Sheets